United States Patent [19]

Pedersen et al.

[11] Patent Number: 4,943,779
[45] Date of Patent: Jul. 24, 1990

[54] DIGITAL SWEEP GENERATOR

[75] Inventors: Peder C. Pedersen, Holden; Thomas J. Green, Jr., Woburn, both of Mass.

[73] Assignee: Worcester Polytechnic Institute, Worcester, Mass.

[21] Appl. No.: 195,790

[22] Filed: May 19, 1988

[51] Int. Cl.$^5$ ..................... H03B 19/00; H03K 17/00
[52] U.S. Cl. ..................... 328/14; 328/181; 328/27; 307/228; 307/271; 307/529
[58] Field of Search ............. 307/228, 529, 260, 271; 328/14, 181, 185, 15, 16, 27

[56] References Cited

U.S. PATENT DOCUMENTS

| | | | |
|---|---|---|---|
| 3,689,914 | 9/1972 | Butler | 328/14 |
| 3,772,681 | 11/1973 | Skingle | 328/14 |
| 4,039,806 | 8/1977 | Fredriksson et al. | 328/14 |
| 4,200,872 | 4/1980 | Sifferlen et al. | 343/75 |
| 4,237,422 | 12/1980 | Lenhardt | 307/228 |
| 4,417,218 | 11/1983 | Berke | 307/228 |
| 4,484,296 | 11/1984 | Treise et al. | 328/14 |
| 4,737,720 | 4/1988 | Mills | 328/14 |
| 4,752,902 | 6/1988 | Goldberg | 328/14 |

FOREIGN PATENT DOCUMENTS 2036483  6/1980  United Kingdom ................. 328/14

OTHER PUBLICATIONS

Fogarty, "Digital Synthesizers Produce Wide Freq. Range from Single Source", Computer Design, Jul. 1975, pp. 100–102.

Tierney et al., "A Digital Frequency Synthesizer", IEEE Trans. on Audio & Electro Acoustics, vol. AU-19, No. 1, 3/71, pp. 48–57.

Jonah McLeod, "One-Chip Waveform Generator Cuts Purchase Price in Half," Electronics, Sep. 3, 1987, pp. 143–144.

Primary Examiner—Timothy P. Callahan
Attorney, Agent, or Firm—Hamilton, Brook, Smith & Reynolds

[57] ABSTRACT

A digital sweep generator includes a counter which receives a clock signal to generate a frequency output and an accumulator which sums the outputs of the counter at each clock. The value held by the accumulator is a quadratic function of time which is used as a phase representation to address a wave generator PROM. The PROM may be selectively coupled to different ranges of accumulator output to set the sweep rate.

10 Claims, 5 Drawing Sheets

DIGITAL SWEEP GENERATOR

BACKGROUND OF THE INVENTION

There are many applications in which a periodic waveform swept through a range of frequencies is required. For example, to characterize the frequency response of a circuit, it may be desirable to apply a sweep signal to the circuit and monitor the response.

Analog circuits which can generate such a sweep signal of significant duration suffer the drawbacks of being unable to operate from a presettable start phase, which would enable coherent waveforms to be generated simultaneously, and of being unable to attain very high sweep rates. The term "coherent" refers to a specified phase relationship between the waveforms.

Digital arbitrary function generators can produce any desired waveforms, including swept frequency waveforms with controlled phase. Precomputation and storage of the signal is required to generate high frequency signals because the digital processors are unable to perform the necessary computations in real time. A drawback of such systems is that the entire signal must be stored in high speed digital memory, and the duration of the signal is thus limited by memory space. For example, in such a system the memory requirement needed to produce a swept signal from zero Hertz to 20 MHz over 60 seconds, using a clock frequency of 100 MHz, is 6 gigabytes of high-speed memory. Such a memory is not feasible today and would exceed the addressing capabilities of even a 32-bit computer.

There exists a need for a sweep generator which can generate in real time a linear sweep signal where the required frequencies are in the MHz range and the sweep duration is many seconds.

DISCLOSURE OF THE INVENTION

With the present invention, a sweep signal of a predetermined periodic waveform swept through a range of frequencies may be generated real time over a longer duration than has previously been possible. A sweep generator embodying the invention comprises a phase generator for generating representations of successive phase angles of the sweep signal between 0 and $2\pi$ radians as a function of time. A waveform generator, which is able to generate a single cycle of the predetermined waveform as a function of phase angle between 0 and $2\pi$ radians, receives the representations of phase angle from the phase generator. Responsive to successive phase angles, the wave generator generates successive cycles of the sweep signal.

Preferably, the sweep generator is a digital circuit which includes a digital look-up table memory as the waveform generator. The phase generator preferably includes a digital counter for counting clock signals and an accumulator for accumulating counts of the counter. The output of the accumulator is a quadratic function of the clock signals applied to the counter and can thus be utilized as a representation of phase of a sweep signal.

In a preferred system, the output of the accumulator comprises a number of output bits greater than the number of input bits applied to the wave generator memory input. The memory input is adapted to be coupled to different subsets of consecutive accumulator output bits. This is possible because the accumulator is selected to be able to store large binary numbers (for example, 36-bit wide) and therefore has a correspondingly large number of output bits. In contrast, the number of memory address lines is relatively small (for example, 8 lines). These memory address lines address the function (sine, cosine, triangular, etc.) that is stored in the memory so that when all the memory locations have been addressed sequentially, the output from the memory corresponds to the binary equivalent of one cycle of the stored waveform. By shifting the memory address lines towards the most significant of the accumulator output bits, more clock cycles are required for the binary value of the memory address lines to vary from (00 . . . 0) to (11 . . . 1). This is equivalent to requiring more clock pulses to scan the memory, and the result is that the sweep rate has been slowed down. Specifically, shifting all the memory address lines one bit towards the most significant bit of the accumulator output reduces the sweep rate by a factor two. The less significant bits from the accumulator which are not connected to the memory are in effect discarded as representations of unneeded phase resolution. The more significant bits which are also not connected to the memory represent counts of cycles through $2\pi$ radians. These are discarded because each cycle of the sweep signal is defined by the look-up table memory with phase inputs in the range of only 0 to $2\pi$ radians.

The counter output may be preset to an initial frequency, and the system may be stopped or reset when the output of the counter reaches a predetermined stop frequency. The accumulator output may be preset to an initial phase. Identical sweep generator modules may be coupled to a common clock input to provide two or more synchronized sweep signals having a predetermined initial phase and frequency relationship.

DESCRIPTION OF A PREFERRED EMBODIMENT

Figure 1:
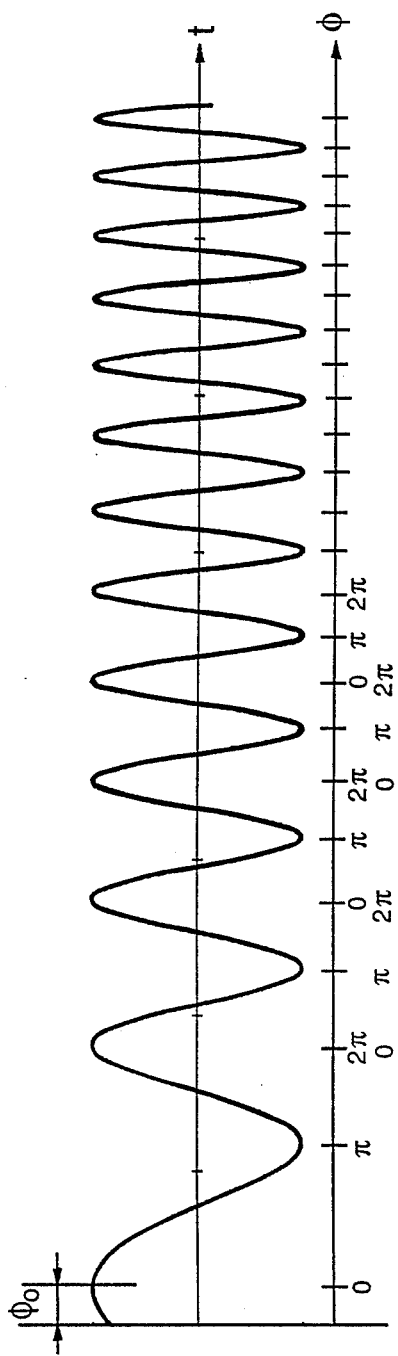
FIG. 1 illustrates a sweep signal.
Figure 2:
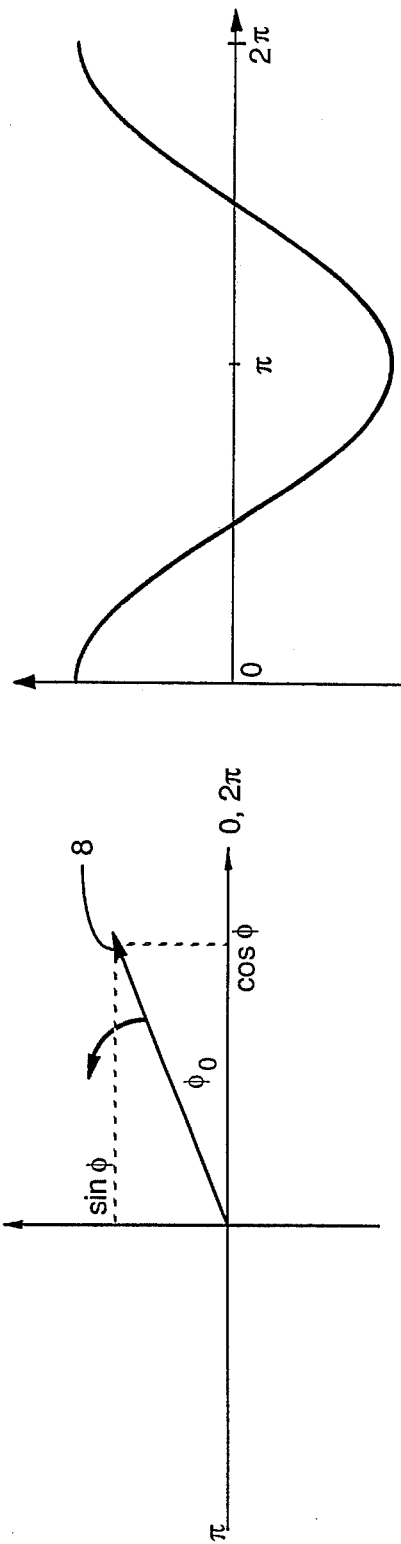
FIG. 2 illustrates a rotating unit vector or phasor which may be used to generate the sweep signal of FIG. 1.

The present invention is best understood with consideration of the time varying phase of a linearly swept signal as illustrated in FIG. 1. FIG. 1 illustrates a cosine signal having an initial phase of $\phi_0$. The frequency of the signal increases linearly with time. The sweep signal of FIG. 1 can be generated by a rotating unit vector 8 illustrated in FIG. 2. The vector 8 rotates at an angular frequency $\omega(t)$. The angle that the vector 8 makes with the horizontal vector pointing to the right is the angle $\phi$ and the starting angle of the vector may be designated $\phi_0$. The length of the projection of the unit vector onto the horizontal cos $\phi$ line is the value of the cosine signal. If the vector were to rotate at a constant speed $\omega$, a sinusoid of constant frequency would result. However, if the speed of rotation $\omega(t)$ increases with time, the frequency of the cosine signal increases to provide the sweep signal of FIG. 1.

Figure 3:
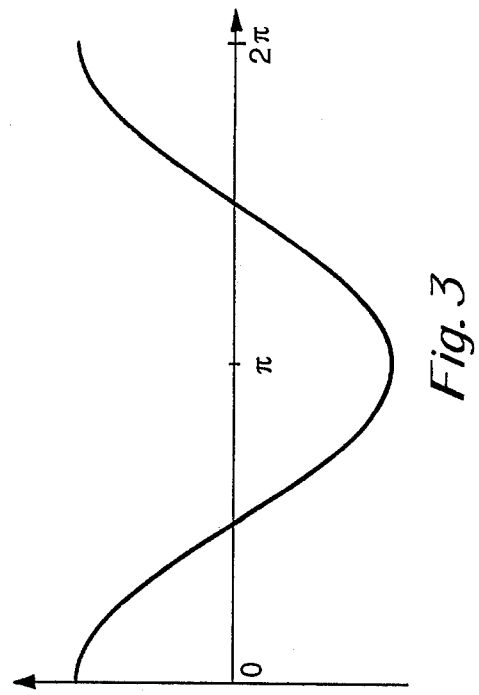
FIG. 3 illustrates a single waveform cycle generated by a sinusoidal wave generator.

In FIG. 1, the phase in radians is plotted on a separate axis alongside the time axis. Note that the time increment for each $2\pi$ radian cycle of the signal becomes less and less with increasing frequency. Because a sinusoid is a periodic function, a single cycle from 0 to $2\pi$ can be defined as illustrated in FIG. 3, and that single definition can be used to generate each cycle of the full sweep signal so long as one can define the phase, between 0 and $2\pi$, as a function of time.

Let $\omega(t)$ be a linearly swept signal with start frequency of $\omega_1$ and sweep rate of S[Hz/s]. Without specifying the stop frequency, $\omega(t)$ is given as:

$$\omega(t) = 2\pi St + \omega_1 \quad (1)$$

The corresponding phase is obtained from integrating (1):

$$\phi(t) = \pi St^2 + \omega_1 t + \phi_0 \quad (2)$$

The phase of a linearly swept signal thus contains a quadratic expression, corresponding to the linearly varying frequency, a linear term, corresponding to the start frequency, and a constant term, corresponding to the start phase. Define $\theta(t)$ as mod $2\pi\{\phi(t)\}$, i.e. $\theta(t)$ is the positive phase angle, between 0 and $2\pi$, remaining when an integer number of $2\pi$ values have been subtracted from $\phi(t)$:

$$\theta(t) = \phi(t) - 2\pi n, \text{ n is an integer}, 0 \leq \theta(t) \leq 2\pi \quad (3)$$

Thus the digital sweep generator of the present invention generates $\phi(t)$ in digital form, then from $\phi(t)$ determines $\theta(t)$, and finally generates the output signal, v(t), as cos $(\theta(t))$. This is done, from a systems point of view illustrated in FIG. 4, by processing the output of the constant source 10 using two integrators 12 and 14, a mod($2\pi$) extractor 16, and a sinusoidal function generator.

Figure 4:
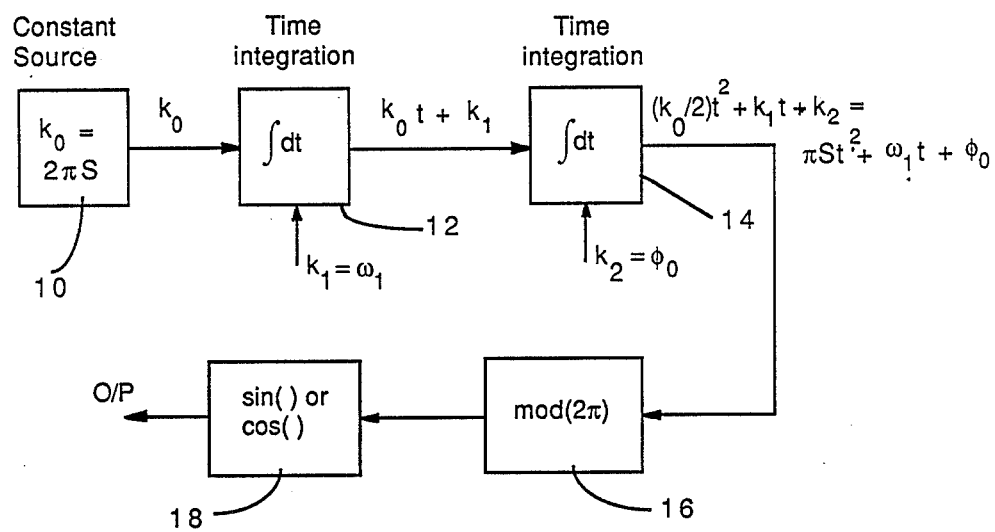
FIG. 4 is a block diagram of a sweep generator embodying the present invention.

By comparing the output from the second time integrator in FIG. 4, $(k_0/2)t^2 + k_1 t + k_2$, with the result given in (2), it is seen that $k_2$ corresponds to the start phase, $k_1$ corresponds to the start frequency, and $(k_0/2)$ corresponds to $\pi S$ where S is the sweep rate. Thus by presetting the time integrators, one can in effect preset start phase and start frequency.

Figure 5:
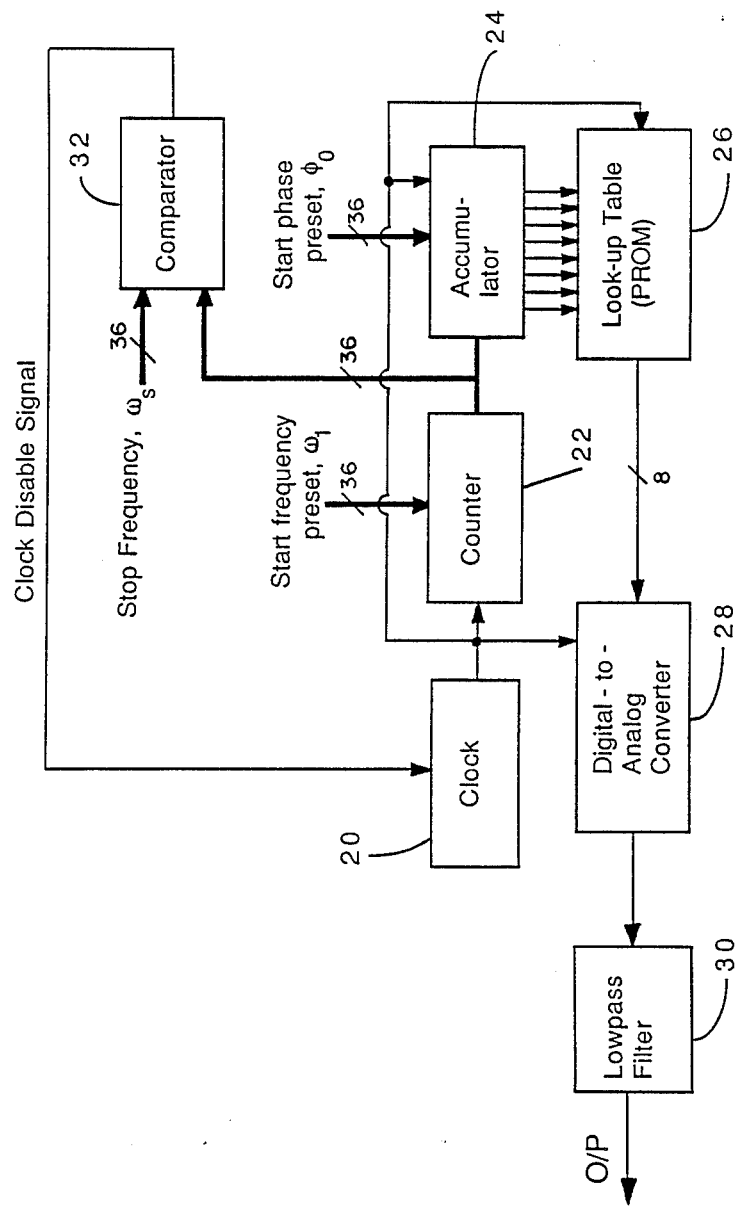
FIG. 5 is a block diagram of a digital implementation of the sweep generator of the present invention.

In the preferred digital implementation of FIG. 5, the constant source is represented by a clock 20, the first time integrator is represented by a counter 22, and the second time integrator is represented by an accumulator 24. The mod ($2\pi$) extraction is performed by selecting a number of consecutive bit lines from the accumulator (in this case 8 bits), and the sinusoidal function is performed by a look-up table stored in a PROM or a RAM 26.

Before the sweep is generated, the counter may be preset with a given binary word, corresponding to the desired start frequency $\omega_1$, and likewise the accumulator may be preset with a given binary word, corresponding to the desired start phase $\phi_0$.

The clock circuit in FIG. 5 determines the highest frequency that the digital sweep generator can generate. If one assumes that 5 points is the minimum number of points required to determine one cycle through a digital-to-analog converter 28, and a maximum frequency of 20 MHz is needed, then the clock frequency should be 100 MHz. A low pass filter 30 is placed after the D/A converter 28 to remove the clock frequency. The cut-off frequency for the LP filter should be chosen so that the LP filter has no amplitude or phase effects on the output signal. For the above-mentioned parameters, one may choose a Bessel-Thompson filter with a 30 MHz cut-off frequency.

The counter must never overflow during the time of one sweep. As will be shown, a 32-bit-wide counter is needed to have a sweep duration of 30 s when a 100 MHz clock is used. A 36-bit-wide counter will, as far as the counter is concerned, allow an 8 min, or 480 s, sweep. However, if the accumulator is kept at the same width of 36 bits, the accumulator will limit the duration of the sweep to about 120 s which is sufficient for most applications.

If the sweep is to start at a frequency difference from 0 Hz, then the counter is preset with a value corresponding to the desired start frequency. Naturally, the maximum sweep time is now reduced, because a shorter time elapses before the counter overflows. As will be seen in the theory section, the widths of the counter and the accumulator actually determine the minimum sweep rate achievable. Since the maximum frequency is specified by the clock frequency, changing the start frequency from DC to some higher frequency and assuming a fixed minimum sweep rate produces a reduced sweep time.

The accumulator is updated every clock cycle with the content of the counter. Since the value of the counter changes linearly with time, the value of the accumulator changes quadratically with time, in accordance with (2).

The 8 lines from the accumulator to the look-up table represent binary encoded address lines to 256 addresses in the PROM. Considering the cosine signal programmed into the PROM, the 256 addresses in the PROM contain cos $(\theta_0)$, cos $(\phi_1)$, cos $(\phi_2)$, ..., cos $(\phi_{255})$ where $\phi_0, \phi_1, \phi_2, \ldots, \phi_{255}$ are 256 phase values equally spaced over $2\pi$ radians or 360°. Hence, $\phi_0$ is 0°, $\phi_1$ is 360/256 = 1.406°, $\phi_{23}$ is 23(360/256) = 32.34°, and $\phi_{255}$ is 255(360/256) = 358.6°.

Consider now the 8 least significant bits from the accumulator. The minimum value of these 8 bits is (00000000) in binary value or 0 in decimal value. The maximum value is (11111111) in binary value or 255 in decimal value. If these 8 bits represent the 8 parallel address lines sent to the look-up table memory, then the encoded 8-bit output from the accumulator to the PROM represents phase between 0 and $2\pi$; 0 (decimal value) corresponds to 0° and 255 corresponds to $(255/256) \times 360°$, or $(255/256) \times 2\pi$[rad].

As consecutive clock pulses increase the binary value contained in the 8 least significant bits of the accumulator towards (11111111), the output of the PROM goes through values of a full cosine cycle. With each clock signal, the accumulator output is incremented by larger and larger steps which increase quadratically in size. When the first "overflow" from the first 8 bits into the 9th bit of the accumulator occurs, one cycle of the cosine wave has been completed. The frequency of that cosine wave is determined by the number of clock pulses required to produce the "overflow." With repeated overflows, the accumulator output continues to cycle through the encoded phase of 0 to $2\pi$ coupled to the PROM 26, but the accumulated value, being a quadratic function of time, cycles through the 0 to $2\pi$ phase values more and more rapidly to provide a sweep signal of increasing frequency. By the chosen definition, the maximum frequency of the sweep signal has been reached when only 5 clock pulses are needed to increase the content of the 8 bits from one "overflow" to the next.

Figure 6:
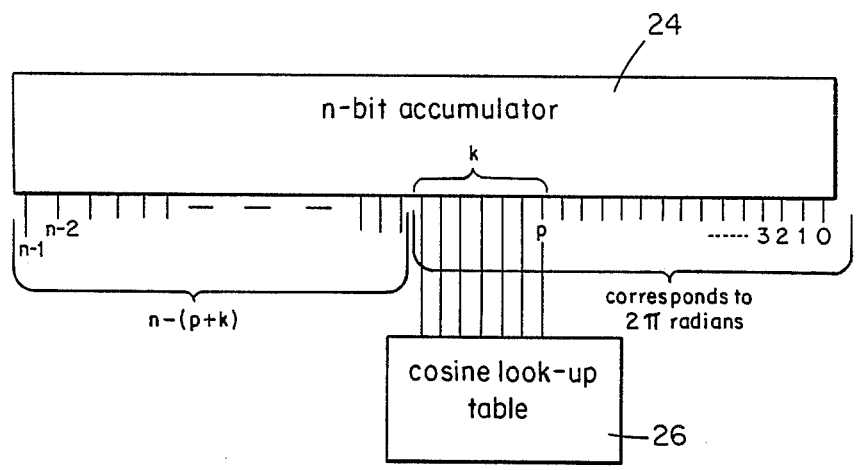
FIG. 6 is an illustration of the coupling between the accumulator and look-up table of FIG. 5.

As illustrated in FIG. 6, the 8-bit input to the cosine look-up table comprises significantly fewer bits than the n-bit output of the accumulator. The look-up table may be coupled to any set of 8 successive output bits of the accumulator. When lines 1 to 8, rather than lines 0 to 7, are used as address lines into the PROM, the time for one cycle of the waveform to be completed, as determined by one cycle of inputs to the single cycle look-up table, is increased; specifically, the sweep rate is reduced by a factor 2. The slowest sweep rate is achieved with the 8 most significant bits from the accumulator.

It is shown later in the Theory Section that the sweep rate is given as:

$$S = (f_{clk})^2 / (2^{p+k}) \quad (4)$$

where $f_{clk}$ is the clock frequency, p is the position of the least significant bit of the accumulator which is used as an input to the look-up table PROM, and k is the number of address lines (normally 8) from the accumulator into the PROM. This means that the highest sweep rate is obtained for $p=0$ and the lowest sweep rate for $p+k=$ full width of the accumulator.

For $f_{clk} = 10^8$ Hz (100 MHz) and $k=8$, the maximum sweep rate is $3.9 \times 10^{13}$ HZ/s, meaning that it would take 0.512 μs to sweep from dc up to 20 MHz. With an $f_{clk} = 50$ MHz, a sweep from dc to 10 MHz would take only 1.024 μs. In the other extreme, assuming an accumulator 36 bits wide, the slowest sweep would be achieved for $p+k=36$. For $f_{clk} = 10^8$ Hz, the sweep rate would be $1.45 \times 10^5$ Hz/s, and it would take 137 s to sweep from dc to 20 MHz. The ratio of the highest to lowest sweep time is no less than $2^{28} = 2.7 \times 10^8$. If the counter is preset with a start frequency, then the sweep time to the maximum frequency is reduced; however, the sweep rates are unchanged. The frequency range which can be achieved with ECL technology is expected to extend to 20 MHz or higher. If the highest frequency required is only 1 MHz, then the clock rate and thee sweep rates may be lowered proportionally. The range of variation of 8 orders of magnitude is still maintained.

As stated, the unique feature of the digital sweep generator is its ability to produce a linearly swept signal of arbitrary duration whose start frequency and start phase can be accurately controlled. The stop frequency, i.e., the frequency at which the sweep stops, can be entered as well. It can be seen in FIG. 5 that the output of counter 22, which represents frequency, can be monitored by a comparator 32 to stop or reset the sweep signal at a frequency $\omega_S$. This is done by means of a clock disable signal. A constant frequency signal of a given frequency and a given start phase can also be produced by presetting the counter with the desired start frequency, and then disabling the signal from clock to counter.

Figure 7:
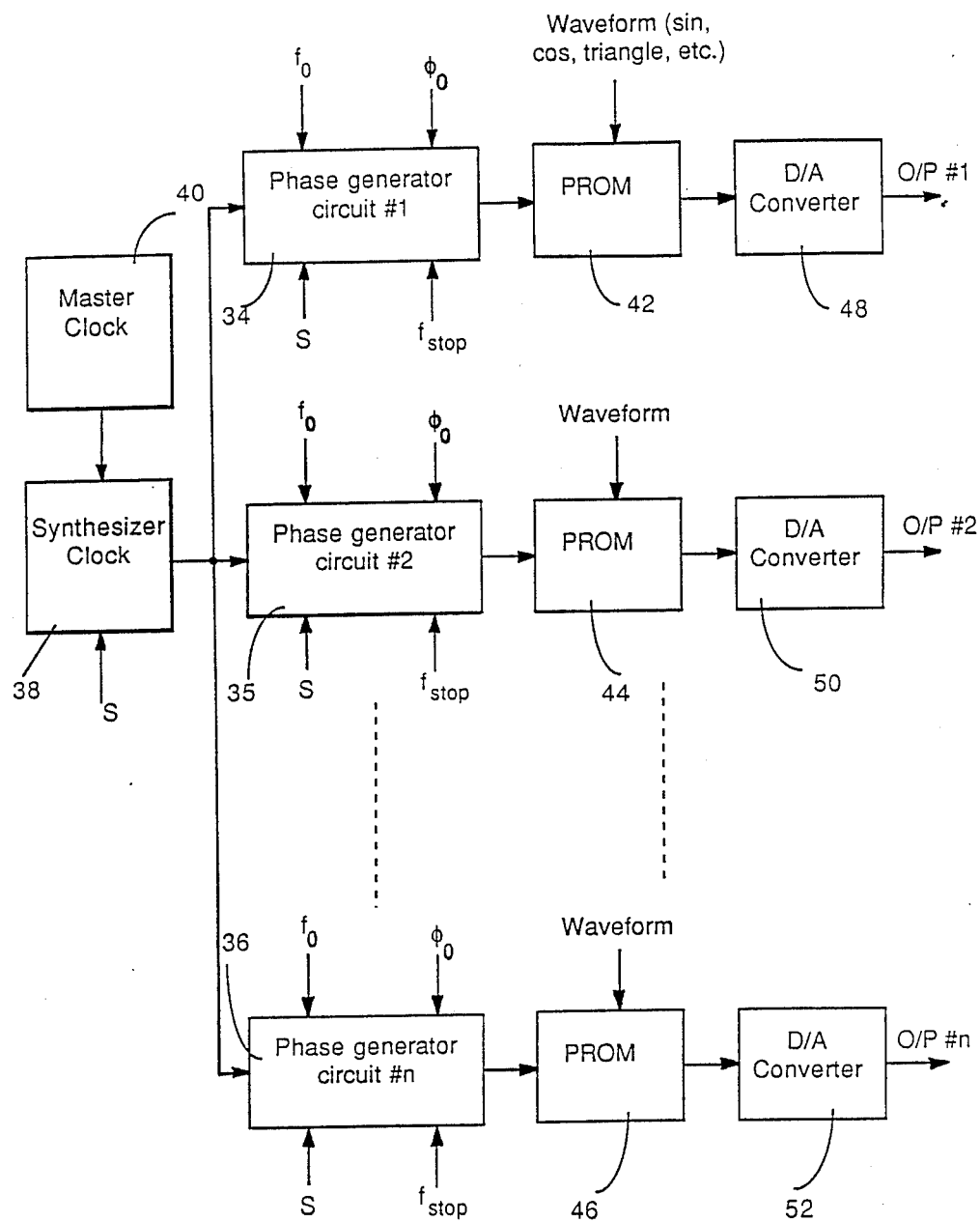
FIG. 7 illustrates a multi-output frequency synthesizer with n sweep generators driven by a common clock.

An extension of the invention is a frequency synthesis system containing several identical units of digital sweep generators. For example, phase generator units 34, 35 and 36 in FIG. 7, operate synchronously from the same synthesizer clock 38. The start phase, the start frequency, and the stop frequency as well as other parameters of each unit can be set in absolute terms. This allows, of course, accurate setting of the relative phase between each unit. Based on a master clock signal from clock 40, an arbitrary sweep rate can be chosen by clock 38 for the entire synthesizer, and the sweep rate of individual modules can be varied in steps of a factor of 2 from this overall sweep rate by selection of accumulator outputs. The individual sweep generators are completed by respective waveform generator PROMs 42, 44 and 46 and D/A converters 48, 50 and 52.

The digital sweep generator can generate linearly swept signals of pre-programmed waveforms, such as sine, cosine, triangular or rectangular waveforms. However, any desired waveform can be stored in a PROM or RAM from which a linearly swept frequency signal can be generated. With the above implementation, the waveform is defined by 256 points which places a limitation on the complexity of the waveform which is used in the swept signal generation. However, there is in principle no limitation to the number of points that can be used in defining the arbitrary waveform.

There are many potential applications of the digital signal generator. It may be used for a coherent swept frequency ultrasound transducer characterization technique. This technique can potentially lead to a more accurate characterization which in turn will improve quantitative ultrasound measurements.

New Doppler imaging techniques may be feasible, using the coherent, swept frequency signal generated by the digital signal generator. This will result in a frequency domain Doppler imaging system, giving both depth and velocity information, as an alternative to the conventional pulse echo Doppler imaging systems.

There are likely to be several applications in the area of communication systems where coherent repetitive swept frequency systems or coherent frequency hopping systems may be useful.

Theoretical and Numerical Analysis

We start out by defining symbols to be used:
t = time (sec)
f(t) = frequency at time t(Hz)
$f_0$ = initial or start frequency (Hz)
S = sweep rate (Hz/sec)
$\phi(t)$ = phase at time t (radians)
$\phi_0$ = initial or start phase (radians)
$\theta(t) = \phi(t) - 2\pi n$, n is an integer, $$0 \leq \theta(t) \leq 2\pi$$

We begin with the equation $$df(t)/dt = S \quad (5)$$

After integrating, we have $$f(t) = \int S dt = St + f_0 \text{ [Hz] and} \quad (6)$$

$$\omega(t) = 2\pi f(t) = 2\pi St + 2\pi f_0 \text{ (rad/sec)} \quad (7)$$

Integrating again, we obtain $$\phi(t) = \int (2\pi St + 2\pi f_0) dt = \pi St^2 + 2\pi f_0 t + \phi_0 \text{ [rad]} \quad (8)$$

We now examine the digital design used to implement this equation and then correlate the values of the digital components with values in equation (8).

We define a unit of time and other values.
unit of time = $t_p$ = period of system clock
t = time (sec)
T = time measured in number of clock cycles (dimensionless)

These values are related by
$T = t/t_p$
$t_d$ = maximum sweep time (sec)
Other important values are:
$CO(T)$ = Counter output $(\sec^{-1})$
$CO_0$ = initial value of counter $(\sec^{-1})$
$AC(T)$ = Accumulator output (dimensionless)
$AC_0$ = initial value of accumulator (dimensionless)

The three basic components of the digital system we consider here are a clock, counter, and accumulator. The output of the clock is 1 ever $t_p$. Since the counter essentially increments by one each cycle, or every $t_p$ seconds, it can be thought of as an integrator with a constant input:

$$CO(T) = \int_0^T 1 \, dT = T + CO_0 \qquad (9)$$

The accumulator adds the current counter output to the accumulator value of the previous clock cycle:

$$AC(T) = CO(T) + AC(T-1) \qquad (10)$$

Equation (10) is simply a summation of the counter output. We can approximate this summation with an integration from O to T:

$$AC(T) = \int_0^T CO(T) dT = \int_0^T (T + CO_0) dt = T^2/2 + CO_0 T + AC_0 \qquad (11)$$

The accumulator output is connected to a cosine look-up table in the form of a Programmable Read Only Memory (PROM) or Random Access Memory (RAM), of the size $(2^k \times q)$
where
k = the number of bits in the PROM addresses
q = the number of bits used for the data in the PROM table
The PROM output is fed into a digital-to-analog converter, followed by a low pass filter to remove the clock frequency from the signal. The output is the actual swept frequency waveform.

The addresses (in bits) in the cosine look-up table may be of variable size not to exceed the size of the accumulator. We denote this variable size k. Therefore, only a limited number of consecutive bits, or lines, from the accumulator output are used as input into the cosine look-up table. The selection of these bits may be defined by two characteristics:
k = the number of bits in the cosine look-up table addresses
p = position of the least significant bit of the accumulator which is used for input into the look-up table. The smallest value of p is p=0. (see FIG. 6)
The input into the cosine look-up table is bits [p, p+1, p+2, ..., p+k−1] where bit p of the accumulator is the least significant bit of the cosine look-up table. Therefore, the input into the look-up table is the output of the accumulator shifted to the right by p bits. This corresponds to dividing the accumulator output by $2^p$ relative to an accumulator output represented by the k least significant bits. If we call the value of the look-up table input $L_1(T)$, then $$L_1(T) = (\tfrac{1}{2^p}) AC(T) = (T^2/2 + CO_0 T + AC_0)/2^p \qquad (12)$$

We note that, since only k bits are used for look-up table input, $L_1(T)$ can vary only between 0 and $2^k - 1$ and there are $2^k$ memory locations in the cosine look-up table. The entire cosine look-up table represents one full cycle of a cosine wave, or $2\pi$ radians. We desire to have the $2^k$ locations represent $2\pi$ radians, and the accuracy of the phase, represented by $\theta(t)$ or $\phi(T)$, is limited to $2\pi/2^k$ radians. The accumulator bits [0, 1, 2, ..., p−1], which are not used, represent unused accuracy. Bits [p+k, p+k+1, p+k+2, ... n] are also not used. These bits actually are a count of the number of completed cycles, which is unrelated to the signal generation. All that is important is the current phase, between 1 and $2\pi$.

When value of $L_1(T)$ varies by $2^k$, the phase is to vary by $2\pi$ radians, so that $$\theta(T) = 2\pi L_1(T)/2^k = 2\pi(T^2/2 + CO_0 T + AC_0)/2^{p+k}, \text{ in [rad]} \qquad (13)$$

Since $\cos[\theta(T)]$ varies from −1 to 1 and the data in the look-up table varies from 0 to $(2^q - 1)$, $$V_{out}(T) = (2^q - 1)(\cos[\theta(T)] + 1)/2 \qquad (14)$$

$V_{out}$ is then the digital input to the digital-to-analog converter, and the output from the digital-to-analog converter is filtered in order to remove the clock frequency using a low-pass filter to produce our final waveform.

Recalling that $T = t/t_p$, we can convert $\theta$ from a function of number of clock cycles [$\theta(T)$] in equation (13) to a function of seconds [$\theta(T)$] as follows:

$$\theta(t) = 2\pi(t^2/2t_p^2 + CO_0 t/t_p + AC_0)/2^{p+k}, \text{ in radians} \qquad (15)$$

Rewriting original theoretical equation (8), $$\theta(t) = \pi S t^2 + 2\pi f_0 t + \phi_0 \qquad (16)$$

The phase function in (15), $\theta(t)$, is the mod $2\pi$ of the phase function in (16), $\phi(t)$. However, the time dependence of (15) and (16) is the same. Therefore, we may now determine values for the variables in the theoretical equation by comparing the two formulas:

$$S = [(2^{p+k})t_p^2]^{-1}, \text{ in Hz/sec} = 2\pi[(2^{p+k})t_p^2]^{-1}, \text{ in rad/sec}^2 \qquad (17)$$

$$f_0 = CO_0[(2^{p+k})t_p]^{-1}, \text{ in Hz} = 2\pi CO_0[(2^{p+k})t_p]^{-1}, \text{ in rad/sec} \qquad (18)$$

An alternate form for equations (17) and (18) is:

$$S = (f_{clk})^2/2^{p+k}, \text{ in Hz/sec} \qquad (19)$$

$$f_0 = (CO_0 f_{clk})/2^{p+k}, \text{ in Hz} \qquad (20)$$

Other important values are:

$$\phi_0 = 2\pi AC_0/(2^{p+k}), \text{ in radians} \qquad (21)$$

$$f(t) = St + f_o = t[(2^{p+k})t_p^2]^{-1} + CO_0[(2^{p+k})t_p]^{-1}, \text{ in Hz} \qquad (22)$$

An example follows. At some time, the sinusoid has completed 295.8839 radians. We actually are interested in the phase of the current cycle, so $295.8839/2\pi = 47.0914$ cycles. The excess of the cycle is $0.0914 \times 2\pi = 0.5742$ radians = phase.

Assume that k=8 and that p=20 so that we are using bits 20–27 of accumulator output for look-up table input. Then all bits more significant than the 27th bit are actually just counters for the numbers of fully completed cycles and do not affect the phase value between 0 and $2\pi$ radians. Bits 0–27 are a measure of phase, but instead of using an accuracy of 27 bits and requiring a 27-bit address RAM, we set our accuracy to k, or 8 bits, corresponding to the 8th most significant bits (bits 20, 21, ... 27) of the 27 representing the current phase. In this particular case, there would be $2^8 = 256$ addresses for a cycle or $2\pi$ radians/256 addresses = 0.0245 radians. This states that the datapoints stored at each address are spaced in increments of 0.0245 radians.

Address # = 0.5742 radians/(0.0245 radians) = 23.43. The first 8 significant bits of the phase would have a value of "00011000" or 23. The remaining accuracy is lost in the lesser significant bits which are not used.

The derivation of the equations for obtaining an arbitrary sweep rate S, an arbitrary start frequency $f_0$, and an arbitrary start phase $\phi_0$ follows: Begin with equations 19, 20 and 21

$$S = (f_{clk})^2/2^{p+k} \tag{19}$$

$$f_0 = CO_0 f_{clk}/2^{p+k} \tag{20}$$

$$\phi_0 = 2\pi AC_0/2^{p+k} \tag{21}$$

where $f_{clk}$ is the clock frequency and $CO_0$ and $AC_0$ are the initial values of the counter and the accumulator, respectively. It is clearly possible to select the 3 desired variables, S, $f_0$ and $\phi_0$ freely when $f_{clk}$, $CO_0$ and $AC_0$ are considered dependent variables. (p+k) determines the output lines from the accumulator to the PROM and can also be considered a dependent variable.

From (19), (20) and (21) we find:

$$f_{clk} = \sqrt{2^{p+k} S} \tag{23}$$

$$CO_0 = f_0 2^{p+k}/f_{clk} = \frac{f_0}{\sqrt{S}} \sqrt{2^{p+k}} \tag{24}$$

$$AC_0 = \frac{\phi_0}{2\pi} 2^{p+k} \tag{25}$$

The stop frequency, $f_{stop}$, is implemented by having a comparator generate a "clock disable" pulse when the counter has reached a content, corresponding to $f_{stop}$. It can be seen that if the initial counter contents $CO_0$, corresponds to $f_0$, then—in a linear fashion—$CO_{max}$ corresponds to $f_{stop}$.

$$CO_{max} = f_{stop} 2^{p+k}/f_{clk} = \frac{f_{stop}}{\sqrt{S}} \sqrt{2^{p+k}} \tag{26}$$

Size (bit Width) Requirements of Components

The Nyquist rate determines the minimum sampling rate needed to accurately sample a waveform. This rate is twice the highest frequency desired. However, in a practical implementation, it is customary to multiply the highest frequency desired by a factor of 5 instead of 2 to acquire minimum sampling rate. Since we obtain one sample per system clock period, $$f_{clk} = 1/t_p = f_{sample} = 5f_{max} \tag{27}$$

$$f_{max} = f_{clk}/5 = [5t_p]^{-1} \tag{28}$$

The only constraint on maximum frequency, therefore, is the speed of the clock one is able to utilize. Any system must be designed to produce a low enough sweep rate ($S_{min}$) such that frequency can vary from DC to $f_{max}$ for a maximum sweep time, $t_d$.

The corresponding sweep rate needed is $$S = S_{min} = \Delta f/\Delta t = (f_{max} - 0)/t_d = f_{max}/t_d \tag{29}$$

When $S = S_{min}$, $p = p_{max}$. The necessary size of the accumulator (n) is defined by $$n = p_{max} + k \tag{30}$$

Rewriting equation (17), equating it to (29), and substituting in n for $p_{max} + k$, we have $$S_{min} = [(2^n) t_p^2]^{-1} = f_{max}/t_d \tag{31}$$

$$2^n = t_d/(f_{max} t_p^2) \tag{32}$$

Applying (28), we get $$2^n = 5t_d/t_p = 5t_d f_{clk} \tag{33}$$

Taking natural log of both sides, we have $$n \ln(2) = \ln(5t_d/t_p) = \ln(5) + \ln(t_d/t_p)$$

The necessary size of the accumulator is therefore given as:

$$n = 2.322 + 1.443 \ln(t_d/t_p) \tag{34}$$

Naturally, n is chosen as the nearest integer, larger than the value calculated in (34).

We now determine the number of bits needed in the counter, which must not overflow during the maximum sweep time, t.

Rewriting equation (9) and assuming that $CO_0 = 0$, $$CO(T) = T \tag{35}$$

Expressing the above equation in terms of t, we have $$CO(t) = t/t_p \tag{36}$$

At time $t_d$, the maximum sweep time, CO(t) is at a maximum $$CO(t_d) = t_d/t_p \tag{37}$$

if c is the size of the counter necessary for it to not overflow, then $$2^c = t_d/t_p \tag{38}$$

Taking the natural log of both sides, $$c \ln(2) = (t_d/t_p)$$

The necessary size of the counter is therefore given as:

$$c = 1.443 \ln(t_d/t_p) \tag{39}$$

Naturally, c is chosen as the nearest integer, larger than the value calculated in (39). From (34) and (39) it is seen that:

$$n = c + 2.322 \qquad (40)$$

If we assume $t_p = 10$ nanoseconds and an 8-bit cosine look-up table, then the following values are obtained for various sweep durations:

| Sweep Duration ($t_d$, sec) | Counter size (c, bits), from (39) | Accumulator size (n, bits), from (34) |
|---|---|---|
| 120 | 34 | 36 |
| 60 | 33 | 35 |
| 30 | 32 | 34 |
| 10 | 30 | 33 |
| 5 | 29 | 32 |
| 2 | 28 | 30 |
| 1 | 27 | 29 |
| 0.1 | 24 | 26 |

While this invention has been particularly shown and described with reference to a preferred embodiment thereof, it will be understood by those skilled in the art that various changes in form and details may be made therein without departing from the spirit and scope of the invention as defined by the appended claims.

We claim:

1. A digital sweep generator for synthesizing a sweep signal of a predetermined periodic waveform swept through a range of frequencies, the generator comprising:
   a counter for counting clock signals and providing a clock signal count;
   means for setting the count from the counter to a value representative of an initial frequency of the sweep signal;
   means for stopping the sweep signal after the clock signal count reaches a value representative of a predetermined stop frequency of the sweep signal;
   a digital accumulator which sums successive clock signal counts from the counter for accumulating a count of clock signals as phase angle values of a sweep signal output as any of different selected sets of multiple bits;
   a look-up table memory for receiving a selected set of multiple bits output from the accumulator and having stored therein values of a single cycle of the periodic waveform as a function of phase angle within a single cycle and responding to different selected sets of multiple bits output from the accumulator to vary sweep frequency of the sweep signal; and
   a digital-to-analog converter coupled to receive and to convert to analog form stored values from the memory through successive cycles of the waveform.

2. A sweep generator as claimed in claim 1 further comprising means for setting the accumulator to an initial phase.

3. A sweep generator as claimed in claim 1 in combination with one or more like sweep generators, the sweep generators being responsive to a common clock signal for providing at least two synchronized sweep signals.

4. A sweep generator as claimed in claim 1 wherein the values stored in the look-up table memory are of a sinusoidal function.

5. A method of synthesizing a periodic waveform swept through a range of frequencies, the method comprising:
   selecting an initial count of clock signals to set an initial frequency and selecting an initial accumulated sum of counts of clock signals to set an initial phase;
   digitally generating a multibit phase signal by counting clock signals and accumulating sums of counts of the clock signals, any of selected sets of bits of which are digital representations of phase angle of successive cycles of the periodic waveform swept through a range of frequencies;
   selecting frequency of the clock signals in combination with selecting one of the selected sets of bits, the bits of the set being less than all bits of the multibit phase signal, to represent a single cycle of the periodic waveform, sweep frequency of the waveform being determined by the selected set of bits;
   digitally generating successive cycles of a sweep signal by means of a single cycle waveform generator responsive to the selected set of bits; and
   stopping the sweep signal when the count reaches a value representative of a predetermined stop frequency.

6. A method as claimed in claim 5 wherein the step of generating the waveform comprises addressing a look-up table memory.

7. A sweep generator for synthesizing a sweep signal of predetermined periodic waveform sweep through a range of frequencies, the generator comprising:
   a counter for counting clock signals to provide counts as indications of frequency;
   a digital accumulator for accumulating counts of clock signals to generate phase angle values of a sweep signal;
   a look-up table memory having stored therein values of a single cycle of the periodic waveform as a function of phase angle within a single cycle and coupled to receive phase angle values output from the accumulator;
   a digital-to-analog converter coupled to receive and to convert to analog form stored values from the memory through successive cycles of the waveform; and
   means responsive to the count from the counter for stopping synthesis of the sweep signal when the count of clock signals indicates a predetermined stop frequency.

8. A method of synthesizing a periodic waveform swept through a range of frequencies, the method comprising:
   counting clock signals to provide an indication of frequency;
   accumulating sums of counts of clock signals to provide a digital representation of phase angle of successive cycles of the periodic waveform swept through a range of frequencies;
   generating successive cycles of a sweep signal by means of a single cycle waveform generator responsive to the digital representations of phase angle; and
   stopping the sweep signal when the count of clock signals reaches a predetermined stop frequency.

9. A sweep generator system for synthesizing sweep signals of predetermined periodic waveforms swept through respective ranges of frequencies, the system comprising:
- a master clock for generating clock signals; and
- a plurality of sweep generators, each sweep generator comprising:
  - a counter for counting clock signals from the master clock;
  - an accumulator for accumulating counts of clock signals as phase angle values of a sweep signal;
  - means for setting the phase angle value from the accumulator to an initial phase angle value;
  - means for setting the count from the counter to a value representative of an initial frequency of the sweep signal;
  - a waveform generator for generating a cycle of a predetermined waveform as a function of phase angle and responsive to the phase angle values generated by the accumulator to generate successive cycles of the sweep signal; and
  - means responsive to the count from the counter for stopping synthesis of the sweep signal after the clock signal count reaches a value representative of a predetermined stop frequency of the sweep signal.

10. A system as claimed in claim 9 wherein the accumulator generates a multibit phase signal, selected bits of which are representative of the phase angle values, and the waveform generator is adapted to be coupled to respond to different selected bits of the phase signal.

* * * * *